(12) United States Patent
Ledden

(10) Patent No.: US 7,012,429 B1
(45) Date of Patent: *Mar. 14, 2006

(54) MAGNETIC RESONANCE IMAGING SYSTEM USING COILS HAVING DISTRIBUTED TRANSMISSION LINE ELEMENTS WITH OUTER AND INNER CONDUCTORS

(75) Inventor: Patrick Ledden, Malden, MA (US)

(73) Assignee: Nova Medical, Inc., Wilmington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/329,200

(22) Filed: Dec. 24, 2002

Related U.S. Application Data

(63) Continuation of application No. 09/684,680, filed on Oct. 7, 2000, now Pat. No. 6,501,274.

(60) Provisional application No. 60/159,662, filed on Oct. 15, 1999.

(51) Int. Cl.
G01V 3/00 (2006.01)

(52) U.S. Cl. .................................................... 324/318

(58) Field of Classification Search ................ 324/318, 324/322, 307, 309, 300
See application file for complete search history.

(56) References Cited

U.S. PATENT DOCUMENTS

| | | | |
|---|---|---|---|
| 4,439,733 A * | 3/1984 | Hinshaw et al. ............. 324/322 |
| 4,638,253 A * | 1/1987 | Jaskolski et al. ............ 324/311 |
| 5,144,243 A * | 9/1992 | Nakabayashi et al. ....... 324/318 |
| 5,280,246 A * | 1/1994 | Takahashi et al. ........... 324/322 |
| 5,445,153 A * | 8/1995 | Sugie et al. ................. 600/422 |
| 5,543,711 A * | 8/1996 | Srinivasan et al. .......... 324/318 |
| 5,578,925 A * | 11/1996 | Molyneaux et al. ......... 324/318 |
| 5,646,531 A * | 7/1997 | Renz ............................ 324/318 |
| 5,721,490 A * | 2/1998 | Takano et al. ............... 324/322 |
| 5,742,163 A * | 4/1998 | Liu et al. ..................... 324/309 |
| 5,777,474 A * | 7/1998 | Srinivasan .................... 324/318 |
| 5,898,306 A * | 4/1999 | Liu et al. ..................... 324/322 |
| 5,986,454 A | 11/1999 | Leifer |
| 5,990,681 A | 11/1999 | Richard et al. |
| 5,998,999 A * | 12/1999 | Richard et al. .............. 324/318 |
| 6,029,082 A * | 2/2000 | Srinivasan et al. .......... 600/422 |
| 6,040,697 A * | 3/2000 | Misic ............................ 324/318 |
| 6,043,658 A | 3/2000 | Leussler |
| 6,150,816 A | 11/2000 | Srinivasan |
| 6,169,401 B1 * | 1/2001 | Fujita et al. ................. 324/318 |
| 6,249,121 B1 * | 6/2001 | Boskamp et al. ............ 324/318 |
| 6,323,648 B1 * | 11/2001 | Belt et al. ..................... 324/322 |
| 6,396,271 B1 * | 5/2002 | Burl et al. .................... 324/318 |
| 6,404,199 B1 * | 6/2002 | Fujita et al. ................. 324/318 |
| 6,411,090 B1 * | 6/2002 | Boskamp ..................... 324/318 |
| 6,420,871 B1 * | 7/2002 | Wong et al. .................. 324/318 |
| 6,501,274 B1 * | 12/2002 | Ledden ........................ 324/318 |
| 6,522,143 B1 * | 2/2003 | Fujita et al. ................. 324/318 |
| 6,590,392 B1 * | 7/2003 | Boskamp et al. ............ 324/318 |
| 6,670,863 B1 * | 12/2003 | Van Helvoort et al. ...... 333/12 |

* cited by examiner

Primary Examiner—Diego Gutierrez
Assistant Examiner—Dixomara Vargas
(74) Attorney, Agent, or Firm—Altman & Martin

(57) ABSTRACT

An magnetic resonance imaging system having a housing comprising a transmit and/or receive inductor system having a coil about the housing axis in proximity with the housing. The transmit and/or receive coil includes a series of electrical transmission line elements distributed with respect to the axis about the subject. Each transmission line element includes an outer conductor and an inner conductor spaced radially from the outer conductor relative to the axis. Capacitive elements are dispersed among the inner conductor and outer conductor. The coil includes capacitive elements connecting pairs of conductors. The capacitive elements may connect pairs of outer conductors or pairs of inner conductors.

59 Claims, 16 Drawing Sheets

MAGNETIC RESONANCE IMAGING SYSTEM USING COILS HAVING DISTRIBUTED TRANSMISSION LINE ELEMENTS WITH OUTER AND INNER CONDUCTORS

CROSS-REFERENCES TO RELATED APPLICATIONS

The present application is a continuation application of Application No. 09/684,680, dated Oct. 7, 2000 for MAGNETIC RESONANCE IMAGING SYSTEM USING COILS HAVING PARAXIALLY DISTRIBUTED TRANSMISSION LINE ELEMENTS WITH OUTER AND INNER CONDUCTORS in the name of Patrick Ledden, now U.S. Pat. No. 6,501,274, which claims the benefit of U.S. Provisional Patent Application No. 60/159,662, dated Oct. 15, 1999 for HIGH RESOLUTION MAGNETIC RESONANCE IMAGING SYSTEM in the name of Patrick Ledden.

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to magnetic resonance imaging and, more particularly, to a high resolution magnetic resonance imaging system and to components thereof.

2. Description of the Related Art

Magnetic Resonance Imaging (MRI) has proven to be an enormously useful technology both for the detection and diagnosis of human disease as well as for research into the understanding of basic animal physiology. However, current MRI equipment has been limited by achievable signal-to-noise ratio (SNR) and by limitations in the ability to generate homogenous transmit fields for signal excitation, particularly at high magnetic field strengths.

For the acquisition of data from a nuclear magnetic resonance (NMR) signal, four separate components are required. First a static magnetic field must be generated by a permanent magnet generally of the superconducting type. Pursuant to quantum mechanics, the presence of the static magnetic field causes in a subject an energy difference between atomic spins aligned with and against this static magnetic field. The magnitude of the energy difference depends on a variety of factors, including strength of the magnetic field, size of the magnetic moments of individual atomic nuclei, and temperature. In general, a majority of the atomic spins will align with the static magnetic field and a higher energy minority of the atomic spins will align against it. When exposed to an oscillating magnetic field of proper frequency, such as is generated by an alternating current in a radio frequency (RF) coil, some of the lower energy spins aligned with the static magnetic field will be excited to the higher energy state of being aligned against the field. Once the applied transmit RF magnetic field is removed, these excited spins will decay to the lower energy state of alignment with the static magnetic field. During the decay, these spins will generate their own RF magnetic field, which can be electronically detected by the same or a different RF coil and thereby be characterized. In order to determine spatial information about the quantity and properties of the atomic nuclei of the subject, a second set of coils, gradient coils, are used to perturb the static magnetic field. By generating magnetic field gradients, current in this separate set of coils spatially changes the oscillation frequency of the atomic spins by changing the frequency of the nuclear magnetic resonance (NMR) oscillation at appropriate times during transmit and receive, and spatial information regarding the atomic spins can be decoded and converted into an image. The generation and reception of the NMR signal in the RF coil and the currents in the gradient coils are controlled by a computer system which processes the information obtained and displays it on a computer screen or printed film for human interpretation.

The advantages of using NMR are several-fold. First, information can be obtained non-invasively on a wide variety of in vitro and in vivo subjects. The lack of non-ionizing radiation is particularly attractive when images are obtained from human subjects. Second, the properties of the magnetic spins are extremely sensitive to their surrounding chemical environment. This allows a great deal of information to be determined from the magnetic resonance signal, including chemical and molecular structure of a wide variety of materials as well as the chemical and structural characteristics of animal and human tissue. By obtaining spatially dependent information regarding the NMR signal, it is possible to obtain detailed images, which not only show great anatomic detail, but which also depend on the chemical properties of tissue. This provides additional image contrast, allows improved discrimination between healthy and diseased tissue, and permits researchers to obtain previously unavailable information regarding in vivo physiologic function.

Despite the multiple advantages of MRI, one major limiting factor in the usefulness of the NMR machine is the small magnitude of the NMR signal generated by a subject's nuclei themselves. This weak signal is easily obscured by the noise present in all electronic detection devices. The presence of this noise then limits the maximum achievable resolution or sensitivity of the NMR machine, specifically, its ability to resolve small anatomic details or to characterize time dependent changes in signal intensity, which are important for understanding of a subject's physiology.

In principle, one can improve the sensitivity of the NMR device by increasing the strength of the static magnetic field. While this does increase signal to noise ratio (SNR), it adds problems in terms of the interaction of high frequency magnetic fields and human tissue, leading to difficulties in achieving uniform image quality and even excitation of NMR spins. Simply increasing the magnetic field strength is a very expensive option: a 3T (3-Tesla) human size magnet costs roughly five times that of a 1.5T magnet. In general, such increased cost places a premium on maximizing SNR at a given field strength.

Most of the noise in human MRI comes from the resistance associated with conductive tissue within the human body. As this resistance is roughly proportional to volume of tissue, large coils, which couple to larger volume of tissue, inherently produce lower quality images than smaller coils. While sensitivity can be improved by making smaller coils, there is a limit to this approach in that eventually the desired body part or region of interest will not fit within the coil or field of view of the coil.

One prior art method designed to increase the field of view of small coils is to use multiple coils arranged in a "phased array" (U.S. Pat. No. 4,887,039). In this method, the images from each individual coil are processed separately and then combined in such a fashion as to maximize image quality. While this is a useful strategy, it has certain limitations. First the individual coils need to be carefully oriented to minimize their respective coupling. Despite proper orientation, there always will be residual coupling between four or more coils limiting the maximum number of coils and consequently the gains in sensitivity. Furthermore, in the standard geometry feasible with surface coils, this arrangement still produces inhomogeneous images, which can complicate their interpretation for diagnostic purposes.

A second problem is the efficient and uniform excitation of the NMR spins. For most imaging sequences, a homogenous excitation of all spins is required. In general, this requires a larger coil, which then reduces the sensitivity of the system. One commonly used technique is to use a larger coil, optimized for transmit with a second coil specialized for receive. However such systems, as presently implemented, suffer from several disadvantages, particularly when used in high field systems. One disadvantage of current volume transmit coils is the inability to control the field to compensate for variations in patient size and position. While, in principle these variations can be accomplished by manually tuning the coil (see J. Thomas Vaughan, Hoby P. Hetherington, Joe O. Out, Jullie W. Pan, Gerald M. Pohost, "High Frequency Volume Coils for Clinical NMR Imaging and Spectroscopy", Magnetic Resonance in Medicine 32:206–218 (1994)) or by using electromechanical relays to switch in additional reactive circuit elements, such methods are time consuming and subject to the variability of mechanical connections.

Conventional MRI coils come in two basic categories. (1) The simpler, the surface coil, consists of one or more conductive loops. Additional reactive circuit components, such as capacitors and inductors, are used to tune the coil and couple energy to or from it to the rest of the NMR system. Importantly, active circuit elements, such as PIN diodes, can be added to allow specialization of coil function for receive or transmit. (2) Volume coils, such as birdcage coils, consist of one or more large surface coils oriented in such a fashion as to produce a homogenous magnetic field. While such coils are in common use, the large size of these coils makes them poor receivers of NMR signal. This difficulty can be overcome by using PIN diodes to "detune" the volume coil for use with a more sensitive surface coil receiver.

In particular, at high fields, the use of volume coils becomes increasing problematic. The large size of these coils required to enclose a useful area of human anatomy, such as the torso or head, leads to them becoming efficient radiators of electromagnetic energy. Moreover, the interaction of large volume coils with tissue at high frequencies leads to non-uniform magnetic fields within human tissue complicating the ability to obtain uniform spin excitation.

The following U.S. Pat. No. 5,557,247 to Vaughn, U.S. Pat. No. 4,751,464 to Bridges, U.S. Pat. No. 4,746,866 to Roschmann and U.S. Pat. No. 4,506,224 to Krause, disclose volume coils based on cavity resonators. Conductive segments within the cavity interact to form a resonant structure. While this coil can offer improved efficiency over a conventional volume coil, several disadvantages exist. First, the structure being closed can give a subject a sense of claustrophobia and make it difficult to present visual stimulation for research purposes. Second, the closed shielded nature of the coil makes it difficult to specialize for the use of transmit or receive purposes. If circuit elements are added to detune the coil, the outer cavity shield will interact with smaller coils placed with the larger cavity, impairing their performance. Additionally, the cavity shield prevents the use of the coil for specialization as a smaller coil to use with receive only function or as its use as a phased array.

BRIEF SUMMARY OF THE INVENTION

The present invention is an improved NMR coil design based on the use of transmission line segments rather than conventional inductive coil elements. The use of transmission lines has several benefits. Transmission lines have a concentration of electromagnetic fields between their elements. By adjusting the distance between these conductive elements, interaction of the magnetic fields of the transmission line with an external sample can be controlled and optimized for NMR signal generation and/or detection. The presence of two conductors also decreases the inductance of each conductor. This minimizes the electric fields associated with the conductors, which is advantageous since these electric fields can be associated with dielectric tissue losses which decrease coil efficiency and sensitivity. Moreover, the inherent shielded nature of transmission lines decreases the radiation of electromagnetic energy from the NMR coil, improving coil efficiency and sensitivity over conventional NMR coil design. The shielded nature of a transmission line also decreases the interaction or coupling between coil elements. This can be advantageous since under proper conditions, coil elements can operate with minimal interaction. This allows a large single coil structure to operate as multiple smaller individual coils. With proper combinations, these separate coils can be combined in such a way to optimize NMR signal generation and/or reception. In particular, by combining signals from individual coil elements, spatial information may be decoded regarding the NMR signal, increasing the sensitivity and speed of data acquisition for both high field and low field NMR systems.

The coil consists of N transmission line segments distributed in a circular, elliptical, or other geometrical arrangement. Each transmission line element is comprised of two or more individual conductors with or without additional lumped or distributed capacitive or inductive circuit components. In general, each transmission line element couples to the others through mutual inductance and capacitive coupling. Additional lumped or distributed inductive or capacitive elements may be placed between the transmission line segments to alter this coupling. The combined influences of the interaction between these elements gives rise to frequency dependent relations between the currents and voltages present on individual transmission line elements. By changing the individual circuit components and transmission line geometry, a given current distribution can be obtained on the transmission line elements at a given frequency. The magnetic field arising from the currents on each element add through superposition and create a given magnetic field configuration for use in either or both the generation and detection of the NMR signal.

In particular, with placement of properly valued reactive components between individual transmission line elements, mutual coupling between elements can be minimized. This allows the resonant structure of the N transmission line segment to become degenerate and allows the currents on each element to be relatively independent. This has the advantage for NMR signal generation in that the currents on each element can be individually controlled at will to generate a excitation field of a desired spatial and phase characteristic. Additionally in such an degenerate mode arrangement, received signals from each element are independent and can then be combined in such a way to optimize image homogeneity, sensitivity, or other desired parameters.

In order for the transmission line structure to be useful, energy needs to be transferred into the coil during signal generation and out of the coil during signal reception. This can be accomplished by inductively or capacitively coupling one or more circuit elements to one or more RF power amplifiers and/or RF receivers. This coupling can be adjusted to allow an arbitrary impedance of such equipment to be matched to the currents and voltages found in the transmission line structure. In particular, the phases of the current in two or more transmission line elements can be offset as to create elliptically polarized magnetic fields for improved efficiency in the generation and/or detection of the nuclear magnetic resonance signal.

In addition to passive components, active circuit elements such as diodes (either regular or PIN) can be added to this structure. With diodes, the tuning of individual transmission line elements or their mutual coupling can be changed in order to modify the current distribution and element impedance of the transmission line segments. When used with one or more additional coils (which may be a combination of transmission line structures or conventional NMR coils), these diodes can be arranged so that during transmit or receive functions, one coil has a desired magnetic field configuration while the other coil presents a high impedance so as not to interfere with the magnetic fields of the first coil. In this manner, each of the two or more coils can be optimized for either transmit or receive, resulting in improved generation and detection of the NMR signal.

Other active circuit elements can be added to the transmission line structure such as vacuum tubes or transistors (including but not limited to conventional bipolar transistors, field effect transistors, gallium arsenide field effect transistors, high electron mobility transistors, pseudomorphic high electron mobility transistors, or heterojunction bipolar transistors). These transistors can be used to provide amplification of either the transmit energy needed in the generation of the nuclear magnetic signal or the small magnitude received energy from the NMR spin decay. In this way, signal losses arising from matching circuits and connecting cables are minimized, leading to improved coil efficiency. If the coil is designed for both transmit and receive functions, diodes may be included to change the coupling between these active amplifier circuits and individual transmission line elements. In this manner, transistors designed for low-noise signal amplification are not damaged by the high element currents during the transmit function and transistors circuits designed for power amplification do not add noise during signal reception.

The addition of active vacuum tube or transistor circuits can provide additional advantages. With proper design, these circuits can present impedance mismatches to the transmission line structure while simultaneously preserving adequate amplifier function. These impedance mismatches can be used to change or minimize coupling between individual transmission line elements, allowing the elements to be decoupled and be relatively independent of each other. During transmit, this has the advantage that individual element currents can be changed electronically in magnitude or phase so as to modify the desired magnetic field for optimal transmit excitation without requiring change or variation of passive circuit elements. This is particularly advantageous at high frequencies where dielectric resonances in human tissue require non-uniform magnetic fields for uniform spin excitation. Additionally, during receive, decoupling of the currents on transmission line elements allows each element to function as a separate signal detector. By combining the signals from these elements electronically, either directly after amplification or at a later stage such as after image reconstruction, these signals can be added in a way such that sensitivity is maximized for one or more areas of interest. In particular, the spatially dependent information from each element can be combined after image reconstruction in such a manner that sensitivity is maximized at each point in an image.

Moreover, the geometric arrangement of the individual transmission line elements can be used to decode spatial information regarding the detected NMR signal. By decoding spatial information from individual coil elements, the steps required for the acquisition of an NMR image can be reduced, allowing the imaging process to be completed in less time.

The illustrated embodiments of the present invention demonstrate an actively decoupled transmission line resonator for use as a transmit coil in conjunction with surface coil receivers, as well as use of a transmission line structure as a receive array coil.

Other objects of the present invention will become apparent in light of the following drawings and detailed description of the invention.

BRIEF DESCRIPTION OF THE DRAWINGS

For a fuller understanding of the nature and object of the present invention, reference is made to the accompanying drawings, wherein.

DETAILED DESCRIPTION OF THE INVENTION

1. Overview

Figure 1:
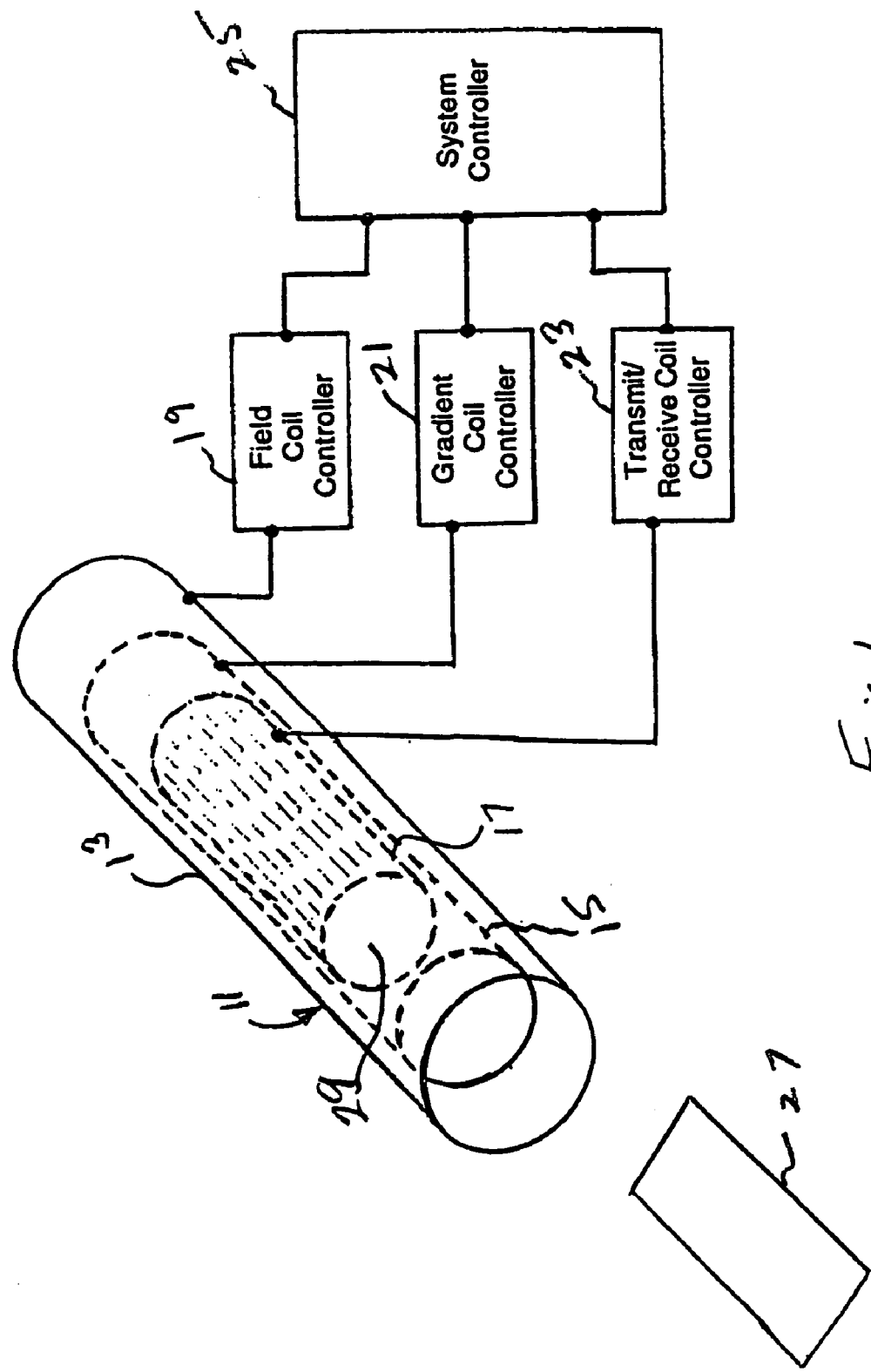
FIG. 1 is a general diagram of a system embodying the present invention.

Generally, the illustrated system of the present invention includes a housing 11 within which are a field coil 13, X, Y, Z gradient coils 15 and a transmit/receive coil 17. Field coil 13 is energized by a field coil controller 19. Gradient coils 15 are controlled by a gradient coil controller 21. Transmit/receive coil 17 is controlled by a transmit/receive coil controller 23. Field coil controller 19, gradient coil controller 21, and transmit/receive controller 23 are managed by a system controller 25. A carriage 27, upon which a subject reclines, is reciprocable into and out of the region 29 within transmit/receive coil 17. Region 29 is a medical diagnostic chamber within which the subject is internally imaged pursuant to the present invention.

Figure 1A:
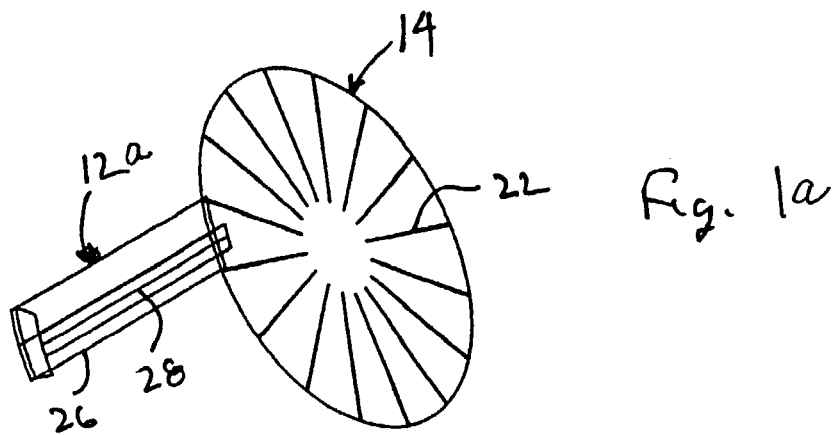
FIG. 1a illustrates a partial assembly of a transmission line coil, with one line element and the rear end plate.
Figure 2:
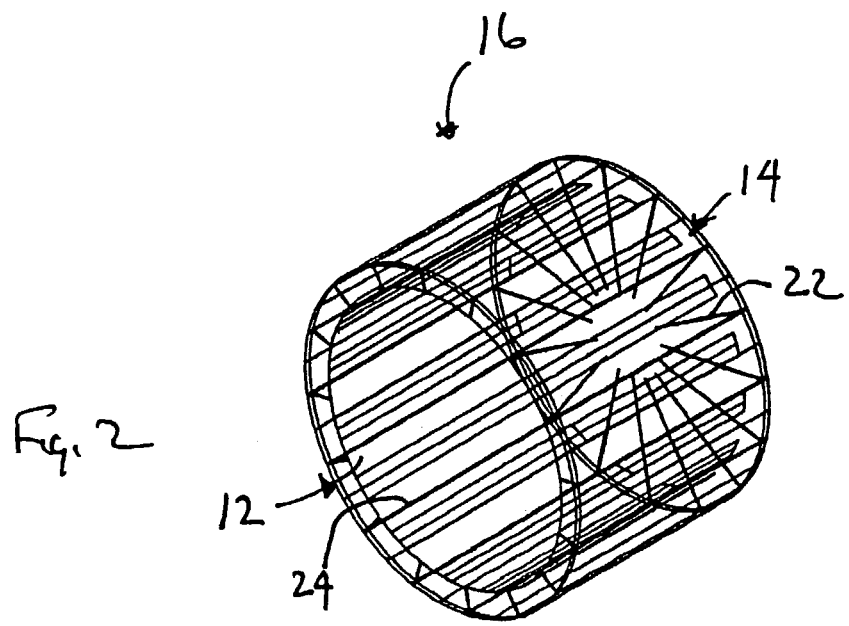
FIG. 2 illustrates a complete transmission line assembly of the type shown in FIG. 1.
Figure 3:
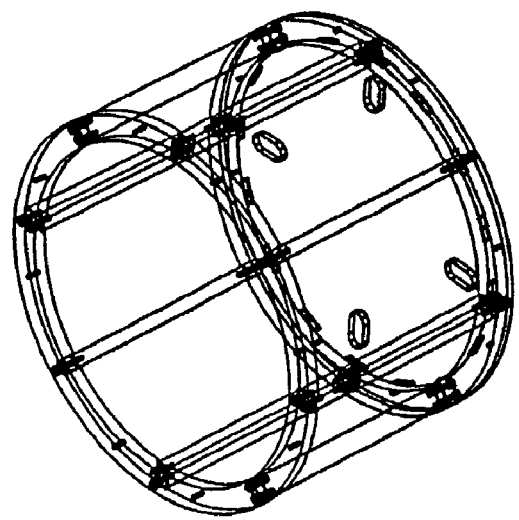
FIG. 3 illustrates a frame for the transmission line assembly of FIG. 2.
Figure 4:
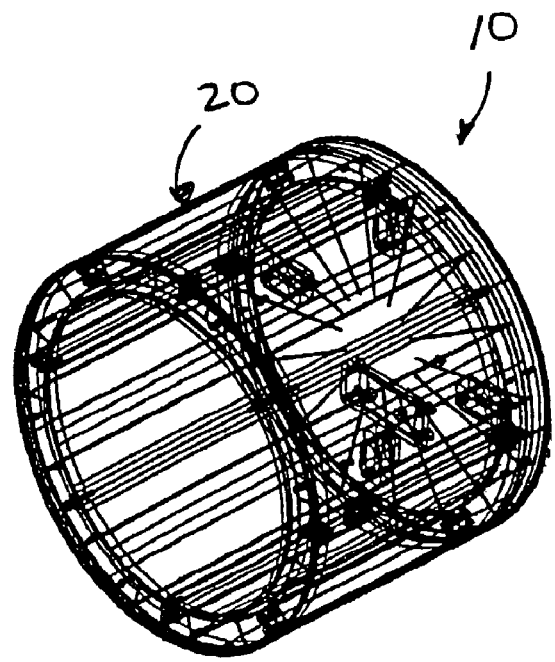
FIG. 4 illustrates a completed coil incorporating the transmission line assembly of FIG. 2 and the frame of FIG. 3.

As shown in FIGS. 1a to 4, the coil at the heart of the present invention, is a transmit and/or receive coil that includes transmission line elements distributed in a circular, elliptical, or other geometrical arrangement. FIG. 1a, for simplicity, shows a single transmission line element 12a (collectively, 12) mounted to a circular end cap 14 with slots 22. The present invention contemplates that the end cap 14 may have another shape, such as a dome, or may be absent altogether. FIG. 2 shows a complete transmission line assembly 16 with all 16 transmission line elements 12. Note that there are gaps 24, corresponding the end cap slots 22, between each of the elements 12. FIG. 3 shows a mechanical frame 18 into which the transmission line assembly 16 is fixed. FIG. 4 shows an entire coil structure 10 including an outside case or housing 20.

Each transmission line element 12 comprises two or more individual conductors 26, 28 with or without additional lumped or distributed capacitive or inductive circuit components. Each transmission line element 12 couples to the others through mutual inductance and capacitive coupling. Additional lumped or distributed inductive or capacitive elements, in various embodiments, are placed between transmission line elements 12 to alter this coupling. The combined influences of the interaction between the elements 12 give rise to frequency-dependent relations between the currents and voltages present on individual transmission line elements 12, as shown in the Kirchoff circuit relationship between transmission line currents and voltages:

$$\begin{bmatrix} Xelem_1(\omega) & Xm_{2,1}(\omega) & \ldots & Xm_{n,1}(\omega) \\ Xm_{1,2}(\omega) & Xelem_2(\omega) & \ldots & Xm_{n,2}(\omega) \\ \cdot & \cdot & \ldots & \cdot \\ \cdot & \cdot & \ldots & \cdot \\ \cdot & \cdot & \ldots & \cdot \\ Xm_{1,n-1}(\omega) & Xm_{2,n-1}(\omega) & \ldots & Xm_{n-1,n-1}(\omega) \\ Xm_{1,n}(\omega) & Xm_{2,n}(\omega) & \ldots & Xelem_n(\omega) \end{bmatrix} \times \begin{bmatrix} I_1 \\ I_2 \\ \cdot \\ \cdot \\ \cdot \\ I_{n-1} \\ I_n \end{bmatrix} = \begin{bmatrix} V_1 \\ V_2 \\ \cdot \\ \cdot \\ \cdot \\ V_{n-1} \\ V_n \end{bmatrix}$$

where $Xelem_j$ is the complex impedance of transmission line element n at frequency $\omega$, $Xm_{i,j}$ is the complex impedance associated with the coupling between elements i and j, $I_n$ is the current through element n, and $V_n$ is the voltage across element n. By changing the individual circuit components and transmission line geometry, a given current distribution can be obtained on the transmission line elements 12 at a given frequency. The magnetic field arising from the currents on each element 12 add through superposition to create a given magnetic field configuration for use in either or both the generation and detection of an NMR signal.

In order for the transmission line structure to be useful, energy must be transferred into the coil 10 during signal generation and out of the coil 10 during signal reception. This can be accomplished by inductively or capacitively coupling one or more elements 12 to one or more RF power amplifiers and/or RF receivers. The coupling can be adjusted to allow an arbitrary impedance of such equipment to be matched to the currents and voltages found in the coil 10. In particular, the phases of the current in two or more transmission line elements 12 can be offset so as to create circularly or elliptically polarized magnetic fields for improved efficiency in the generation and/or detection of the NMR signal.

In addition to passive components, in various embodiments, active circuit elements such as diodes (either regular or PIN) are added to the circuit. With diodes, the tuning of individual transmission line elements 12 or their mutual coupling can be changed in order to modify the current distribution and element impedance of the transmission line elements 12. When used with one or more additional coils 10 (which may be a combination of transmission line structures or conventional NMR coils), these diodes can be arranged so that, during transmit or receive functions, one coil 10 has a desired magnetic field configuration while another coil 10 presents a high impedance, so as not to interfere with the magnetic fields of the first coil 10. In this manner, each of the two or more coils 10 can be optimized for either transmit or receive, resulting in improved generation and detection of the NMR signal.

In addition to diodes, in various embodiments, other active circuit elements are added to the transmission line structure 16. These include vacuum tubes or transistors (including but not limited to conventional bipolar transistors, field effect transistors, gallium arsenide field effect transistors, high electron mobility transistors, or heterojunction bipolar transistors). Transistors can be used to provide amplification of either the transmit energy needed in the generation of the NMR signal or the small received energy from the NMR spin decay. In this way, signal losses arising from matching circuits and connecting cables are minimized, leading to improved coil efficiency. If the coil 10 is designed for both transmit and receive functions, diodes may be included to change the coupling between the active amplifier circuits and individual transmission line elements 12. In this manner, transistors designed for low-noise signal amplification are not damaged by the high element currents during the transmit function, and transistor circuits designed for power amplification do not add noise during signal reception.

The addition of active vacuum tube or transistor circuits can provide additional advantages. Pursuant to the present invention, these circuits can present impedance mismatches to the transmission line structure 16 while simultaneously preserving adequate amplifier function. Impedance mismatches can be used to change or minimize coupling between individual transmission line elements 12 allowing the elements' currents to be decoupled and relatively independent of each other. During transmit, this has the advantage that individual element currents can be changed electronically in magnitude or phase so as to modify the desired magnetic field for optimal transmit excitation without requiring change or variation of passive circuit elements. This is particularly advantageous at high frequencies where dielectric resonance in human tissue require non-uniform magnetic fields for uniform spin excitation.

Additionally, during receive, decoupling of the currents on transmission line elements 12 allows each element 12 to function as a separate signal detector. By combining the signals from these elements 12 electronically, either directly after amplification or at a later stage such as after image reconstruction, these signals can be added in such a way that sensitivity is maximized for one or more areas of interest. In particular, the spatially dependent information from each element 12 can be combined after image reconstruction in such a manner that sensitivity is maximized at each point of an image. Moreover, the geometric arrangement of the individual transmission line elements 12 can be used to decode spatial information regarding the detected NMR signal. By decoding spatial information from individual coil elements 12, the steps required for the acquisition of an NMR image can be reduced, allowing the imaging process to be completed more quickly.

2. Preferred Coil Configurations

Figure 5:
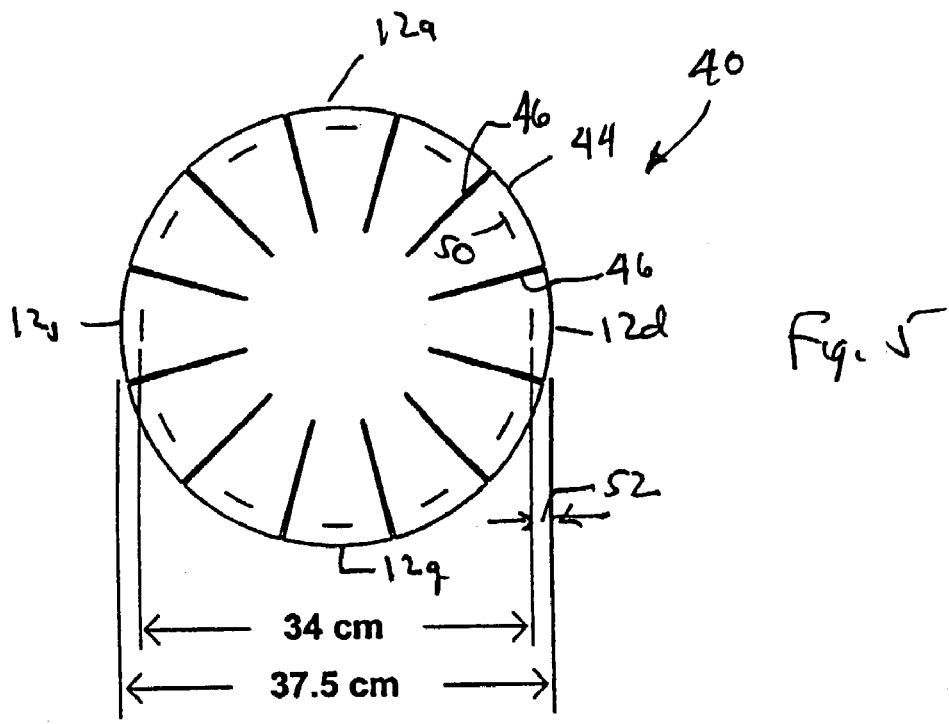
FIG. 5 is an end view of a detunable head transmit coil embodying the present invention.
Figure 6:
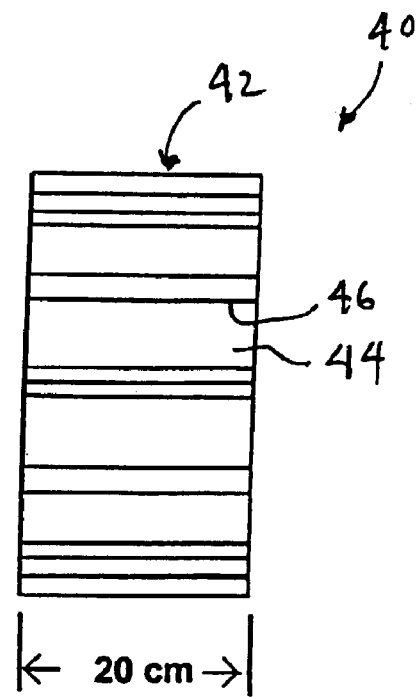
FIG. 6 is a side view of the detunable head transmit coil of FIG. 5.

FIGS. 5 and 6 show the geometry of a detunable volume transmit coil 40 constructed in accordance with the present invention. The volume coil 40 is a flat element, shielded transmission line design that is analogous to a previously described design utilizing coaxial elements. (See U.S. Pat. No. 4,746,866 to Roschman and U.S. Pat. No. 5,557,247 to Vaughan.) The coil 40 incorporates an end-capped structure that decreases radiation losses. A conductive cavity wall 42 is divided into 12 outer conductors 44 by regularly spaced longitudinal slots 46. The slots 46 minimize eddy currents when used in echo planar imaging (EPI). In one configuration, the diameter of the coil 40 is 37.5 cm and the axial length is 20 cm. Twelve flat copper inner conductors 50, each with a width of 2.5 cm, are located 1.75 cm inwardly from the cavity wall 42, as at 52, and centered between the slots 46. The inner conductors 50 are tuned using nonmagnetic chip capacitors and nonmagnetic tuning capacitors. Two elements 12a, 12d, located 90° from each other, are matched to 50 Ω using lumped element quarter-wave transformers. These outputs then are driven through a quadrature coupler.

Figure 7:
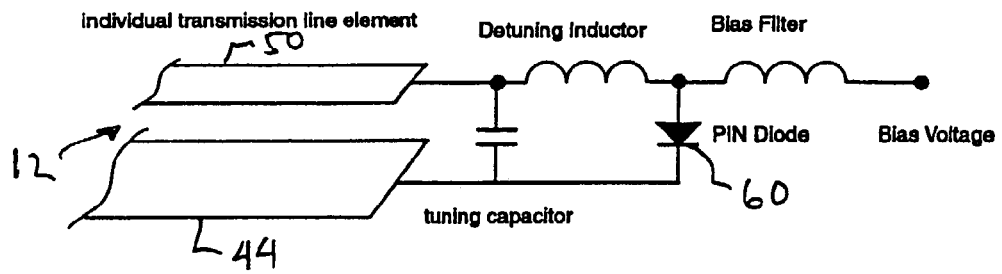
FIG. 7 is an electrical schematic of a detuning circuit in accordance with the present invention.
Figure 8:
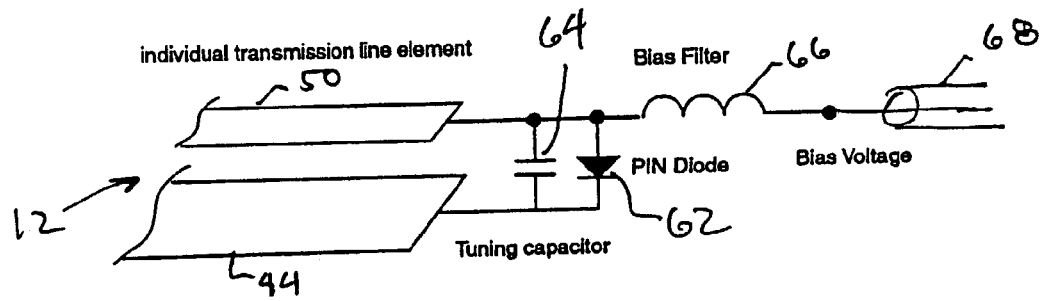
FIG. 8 is an electrical schematic of a second detuning circuit in accordance with the present invention.

In one configuration, shown in FIG. 7, detuning is accomplished with a diode 60. The circuit shown in FIG. 8 utilizes a shunt diode configuration similar to that described in Ledden, P. J., Wald, L. L., Vaughan, J. T., "Volume Coil Transmit Surface Coil Receive System for Brain Imaging at 3T", Proceedings of the International Society of Magnetic Resonance in Medicine, p. 168 (1999). In this arrangement, a diode 62 is placed across the tuning capacitor 64 at the posterior end of every element 12. During transmit, the diodes 62 are back biased and have a high impedance allowing normal tuned coil operation. During receive, the diodes 62 are forward biased, shorting the tuning capacitors 64 and detuning the coil 10. Bias voltage is applied to each diode 62 through high impedance RF chokes 66 which have an RF impedance of greater than 1 KΩ at 127.8 MHz. The diode bias voltage is provided by a coaxial cable 68 separate from the RF connections and is controlled by a 5 V digital signal from a scanner.

Figure 9:
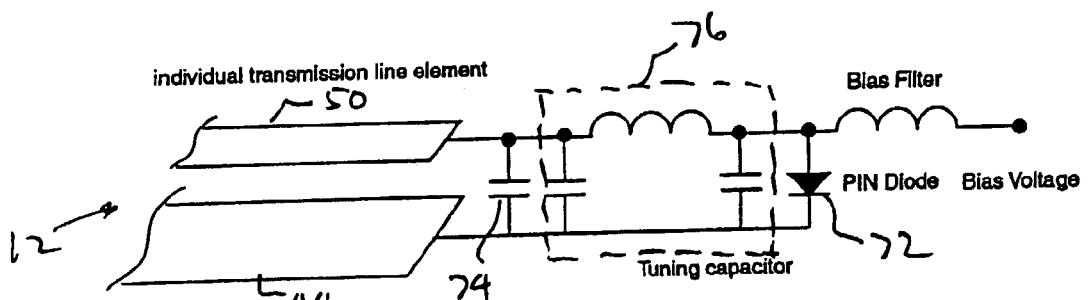
FIG. 9 is an electrical schematic of a third detuning circuit in accordance with the present invention.

In another configuration, shown in FIG. 9, detuning utilizes a lumped element quarter wave line 76 between the diode 72 and the tuning capacitor 74. In this arrangement, the diode 72 is forward biased during transmit and shorts the quarter wave circuit 76. This causes the quarter wave circuit 76 to present a high impedance across the tuning capacitor 74 allowing normal coil resonance. During receive, the diode 72 is back biased and causes the quarter wave circuit 76 to short the tuning capacitor 74, thereby detuning the coil 10. Unlike the configuration in FIG. 9, high negative bias voltages are not required, since during receive, the RF voltages in the coil 10 are very small. This eliminates the need for a high voltage bias supply and driver resulting in improved operator and patient safety.

Figure 10:
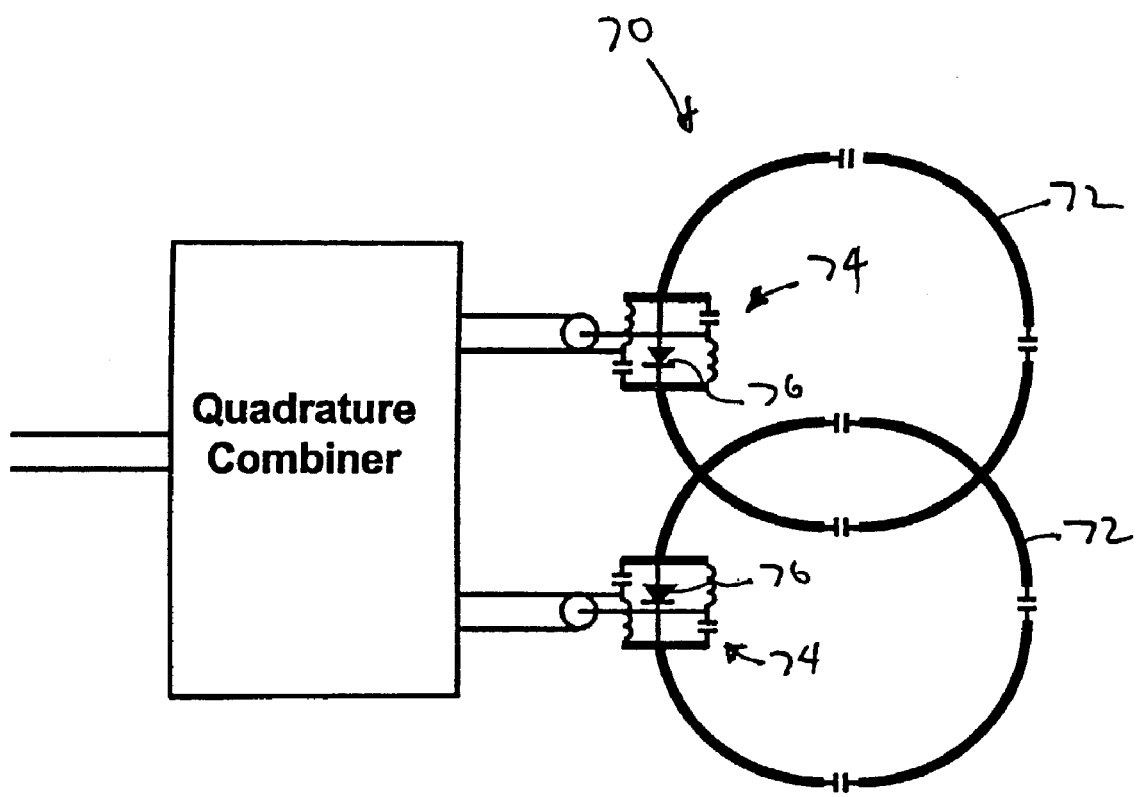
FIG. 10 is an electrical schematic of a receive-only circuit in accordance with the present invention.

Two different geometries of receive-only surface coils are presented herein. The first coil consists of a quadrature surface coil 70 comprising two 9-cm loops 72, as in FIG. 10. Of similar overall design, the second coil consists of two 12 cm×20 cm curved rectangular loops, also combined in quadrature. Each coil is matched to 50 Ω using a standard balun drive circuit 74. Detuning during transmit is accomplished by placing a PIN diode 76 across the balun 74. In the conductive state, this diode 76 shorts the balun 74, causing the coil 70 to double tune with a null at the 128 MHz.

All electrical impedance measurements in the aforementioned embodiments were made with a network analyzer. The isolation produced by the diode detuning of the transmit coil was determined by the change in radio frequency transmission between two untuned 2.5-cm-diameter probe coils loosely coupled to the volume coil. The isolation was taken as the difference in radio frequency insertion loss in decibels at 127.8 MHz between the tuned and detuned states. The two probe coils were physically separated and made electrically orthogonal to minimize their inductive coupling. A similar method was used to measure the degree of detuning obtained by the active PIN diode trap structure on the receive surface coils.

3. Coil Design—Imaging Tests

All studies were performed using a 3T system incorporating an 80-cm bore magnet, and a resonant gradient coil for EPI. Coil SNR was calculated by dividing the image intensity by the standard deviation of the background noise. Transmit efficiency was compared to the standard commercial 16-rung birdcage coil (28 cm diameter and 30 cm length) provided with the system by comparing the transmit gain required for 90° spin echo excitation. All human studies were conducted with Institutional Review Board (IRB) approval.

4. Coil Design—Bench Tests

Measurements of the detuning of the transmit coil were as follows. Greater than 40 dB of isolation was achieved between the tuned and detuned states using either of the diode detuning methods. With careful adjustment, the PIN diode trap circuit on the receive coils also provided greater than 40 dB of isolation in the detuned state. Less than 100 kHz change in loaded resonant frequency occurred when either receive-only surface coil was placed within the detuned transmit coil.

5. Coil Design—Imaging Examples

The transmit power required for a 90° pulse excitation for the transmission line resonator was compared to a standard commercial birdcage coil. Despite its larger size, the transmission line resonator without detuning circuitry had approximately 10% greater efficiency than did the birdcage design. Some loss of coil efficiency occurred with either detuning circuit. Addition of the direct shunt diode configuration reduced the transmit efficiency by an amount dependent on the reverse bias voltage applied. Conversely the quarter wave diode short configuration required only enough bias voltage to forward bias the diode, but coil efficiency depended on bias current. With the direct shunt diode circuit, coil efficiency was reduced approximately 0.5 db with −250 V diode back bias. In comparison, the quarter wave diode short circuit reduced coil efficiency 75 db with 200 mA forward bias current.

Figure 11:
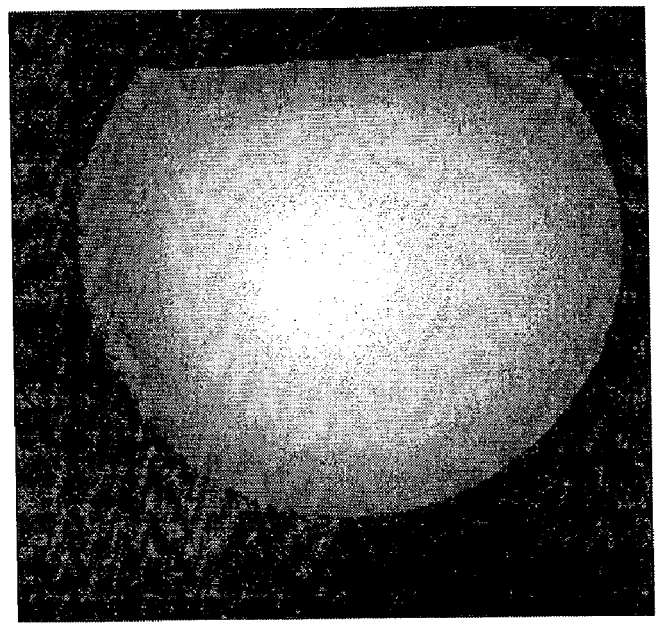
FIG. 11 illustrates an image produced by a head transmit coil for both transmit and receive in accordance with the present invention.
Figure 12:
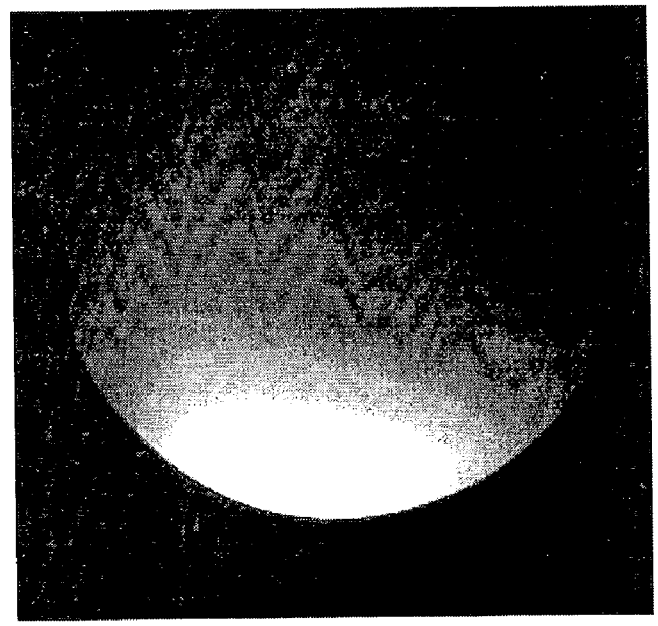
FIG. 12 illustrates an image produced by a head transmit coil for transmit and a dual loop coil for receive in accordance with the present invention.

FIGS. 11 and 12 show phantom images taken with the head transmit coil system. FIG. 11 shows the volume coil transmitter being used both for transmit and receive. With the relatively large size of the head transmit coil, highly uniform transmit excitation was achieved. FIG. 12 shows the results when the detunable volume coil was used for transmit and a dual 9-cm loop pair was used for receive. Image intensity decreased smoothly as a function of distance from the receive coil elements, indicating the absence of surface coil focusing of the transmit fields and good detuning of the transmit coil during receive.

Figure 13:
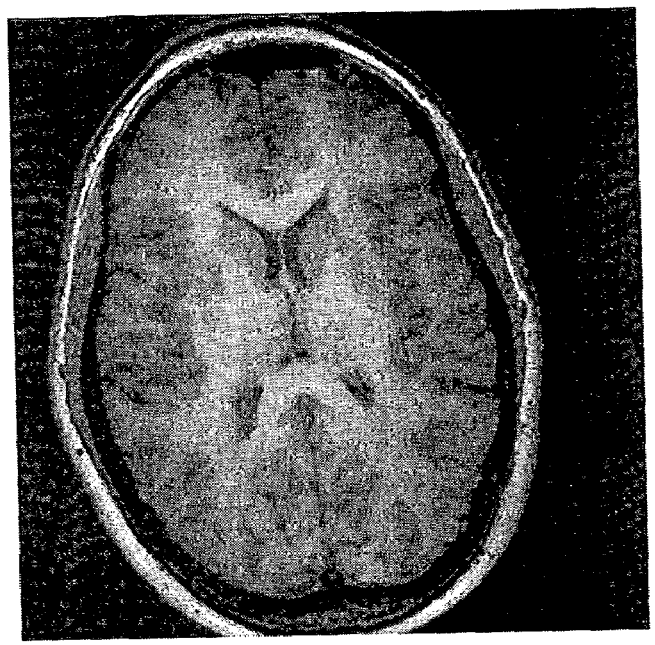
FIG. 13 illustrates a human brain image produced by a head transmit coil used for both transmit and receive.
Figure 14:
FIG. 14 illustrates a human brain image produced by a head transmit coil used for transmit and a loop coil for receive.

FIGS. 13 and 14 show other results obtained with a human subject. In FIG. 13, the transmit coil was used for both transmit and receive. The relatively large size of the transmit coil results in a uniform transmit field over the human brain. Image SNR was approximately 10% greater than with the birdcage head coil. FIG. 14 shows the results obtained when the detunable volume coil was used for transmit and the dual 9-cm loop pair was used for receive. As with the phantom image, the surface coil receivers markedly increased local SNR. In comparison to the birdcage head coil, the combination of the head transmit coil and receive-only 9-cm loop pair provided up to 500% improvement in cortical SNR.

Figure 15:
FIGS. 15, 16, and 17 illustrate image intensity corrected images produced by receive-only coils.
Figure 16:
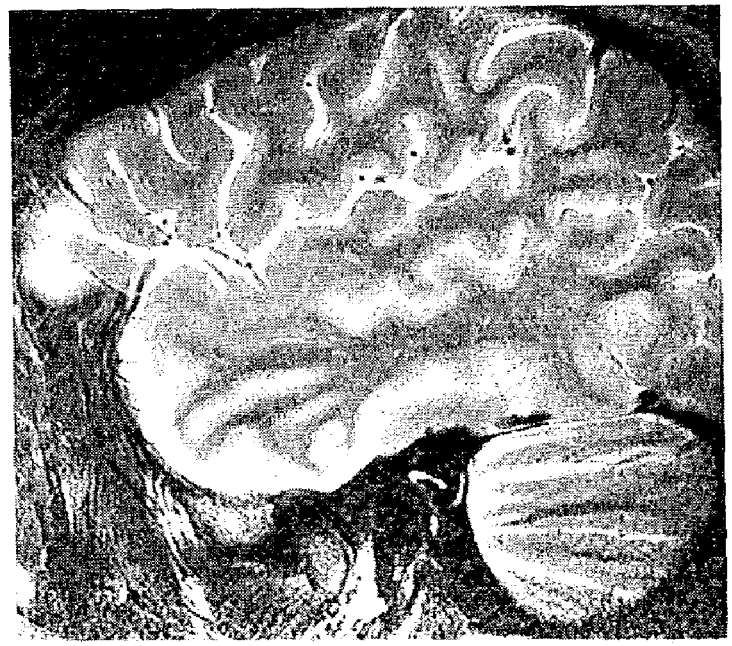
Figure 17:
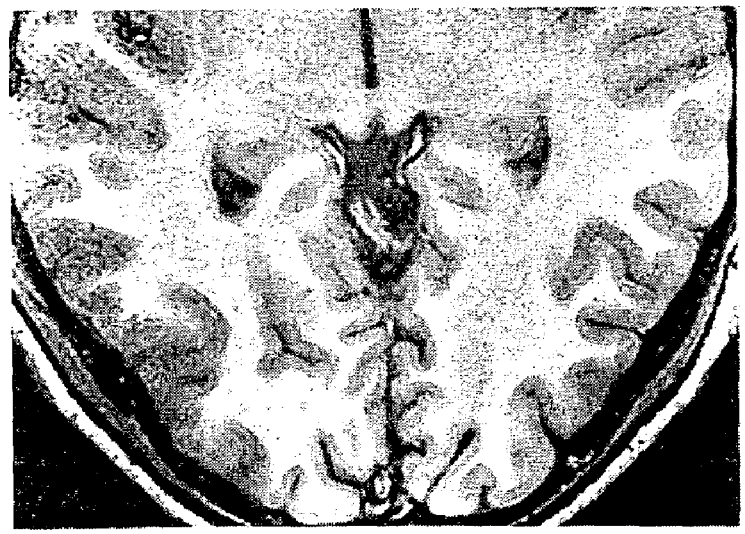

FIGS. 15, 16, and 17 show intensity corrected images obtained with the receive-only coils. In comparison with the smaller 9-cm loop pair, the larger rectangular quadrature coil provided up to a 350% increase in occipital SNR with broad coverage including most of the posterior half of the brain. The increased SNR with both of these receive-only coils allowed images with 400-µm in-plane resolution and 1.5-mm slices to be obtained with a minimum of signal averages. As seen in the magnified images, the combination of high in-plane resolution and thin slice thickness allows subtle cortical details to be visible.

These results demonstrate the feasibility of a volume coil transmit, surface coil receive system for brain imaging at 3T. Despite the high frequency and close proximity to the surface coil, adequate isolation was achieved between the detuned transmit resonator and the surface coil receiver during both transmit and reception. The receive-only surface coil provided a marked increase in local SNR.

Both PIN diode arrangements provide adequate detuning, though each method has its own advantages and disadvantages. The shunt diode arrangement is simpler and minimizes loss of coil efficiency due to the detuning circuitry. However, a relatively large bias voltage is required to back-bias the diodes during transmit. The quarter wave circuit eliminates the requirement for these potentially dangerous bias voltages.

For the small receive coil employed in this study, designs derived from 1.5T applications are found to be satisfactory with increased distribution of the coil tuning capacitance. The capacitance is found to require 3 to 4 times as many distributed capacitors than at 1.5T in order to minimize load dependent frequency change. When using a resonant trap detuning circuit, stable coil resonance is important not just for optimal system noise figure but also for good isolation in the detuned state. Frequency dependent load changes are also minimized by the use of a balun drive, which symmetrized the electric fields of the coil.

The phantom and human images demonstrate the feasibility of PIN diode detuning of high frequency transmission line resonators for use with surface coil receivers at 3T. The use of small local surface coil receivers allow improved SNR for a wide variety of brain imaging applications at 3T and enable full utilization of the increased sensitivity of high field MR systems.

Figure 18:
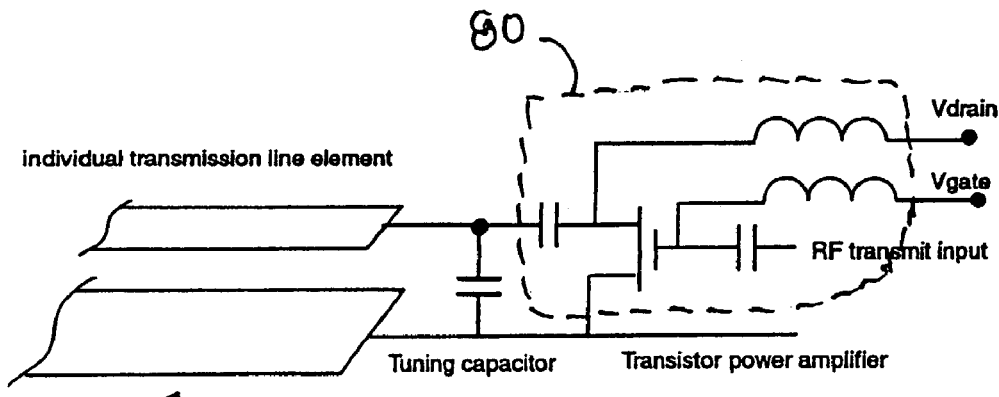
FIG. 18 illustrates a power amplifier directly connected to an individual transmission line element in accordance with the present invention.
Figure 19:
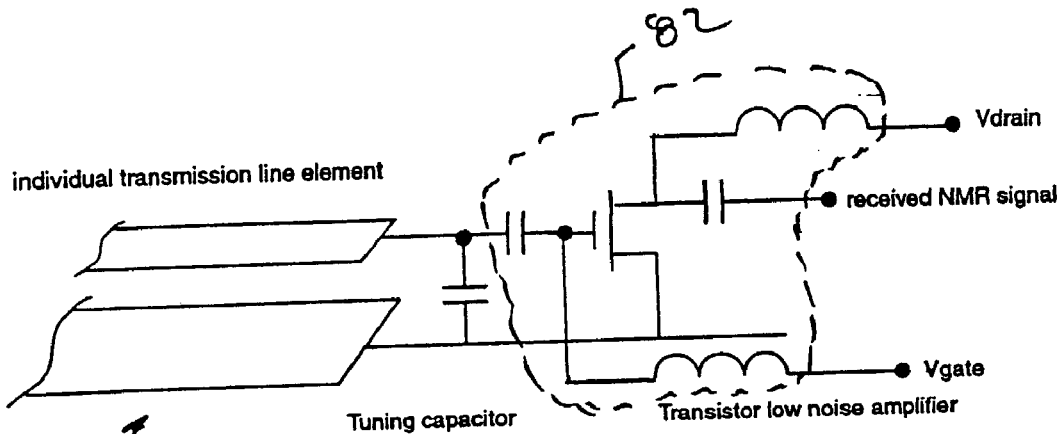
FIG. 19 illustrates a low-noise transistor amplifier directly connected to an individual transmission line element in accordance with the present invention.
Figure 20:
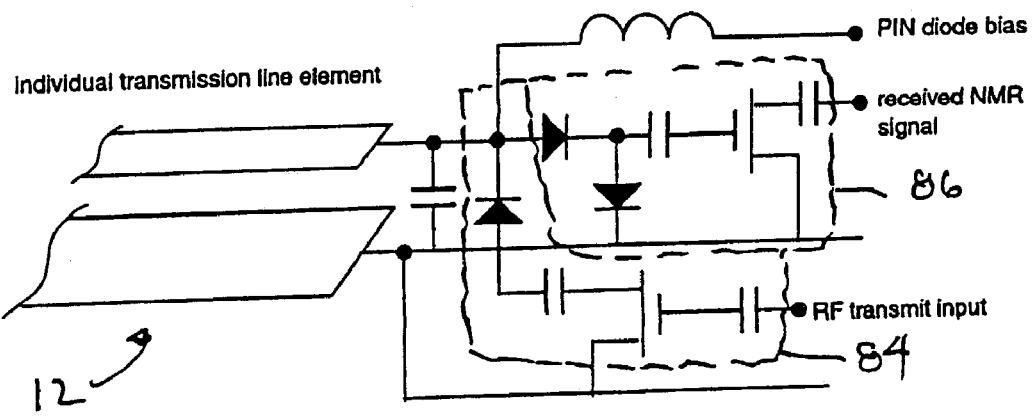
FIG. 20 illustrates a combination of active transmit and receive circuits directly connected to an individual transmission line element in accordance with the present invention.

As indicated above, the present invention contemplates the connection of active transistor amplifiers directly to one or more of the transmission line elements. Thus, FIG. 18 shows a power transistor amplifier 80 directly connected to an individual transmission line element 12. FIG. 19 shows a low-noise transistor amplifier 82 directly connected to an individual transmission line element 12. FIG. 20 shows a combination of an active transmit circuit 84 and active receive circuit 86 directly connected to an individual transmission line element 12 with PIN diode switching. Transistor and PIN diode DC connections are omitted for clarity.

6. Overall System Design and Operation

Figure 21:
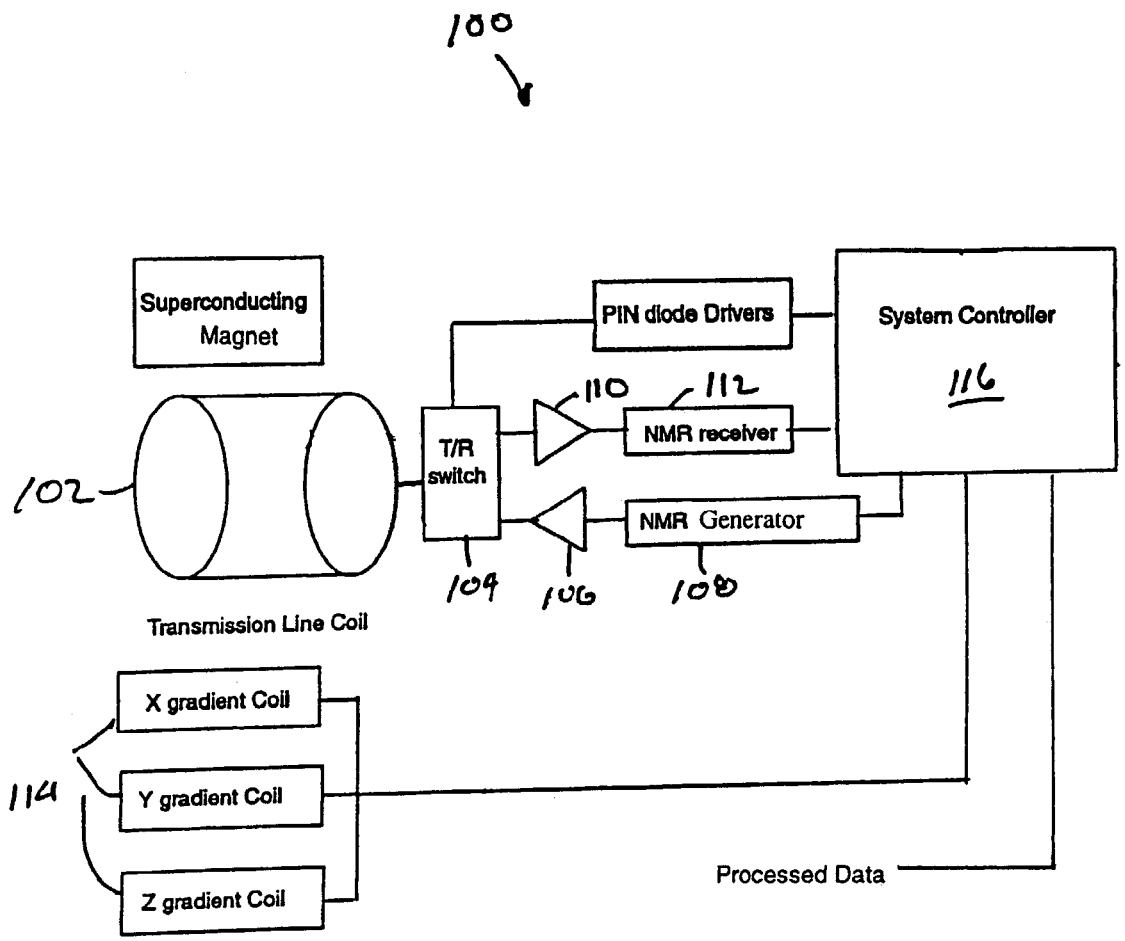
FIG. 21 illustrates an overall system diagram in connection with a transmission line coil used for both transmit and receive in accordance with the present invention.

FIG. 21 is a diagram of a system 100 that uses a transmission line coil used for both transmit and receive. As shown, one or more coil elements 102 are connected through matching circuits directly or through a signal combiner, such as a quadrature combiner, to a transmit/receive (T/R) switch 104. During NMR signal generation, the T/R switch 104 connects the transmission line coil 102 to an RF generator 108 through a power amplifier 106. During NMR signal detection, the T/R switch 104 connects the coil 102 to a signal receiver 112 through a low-noise preamplifier 110. In conjunction with properly timed magnetic field gradients coils 114, the system controller 116 acquires data and processes it into an image or other useful form.

Figure 22:
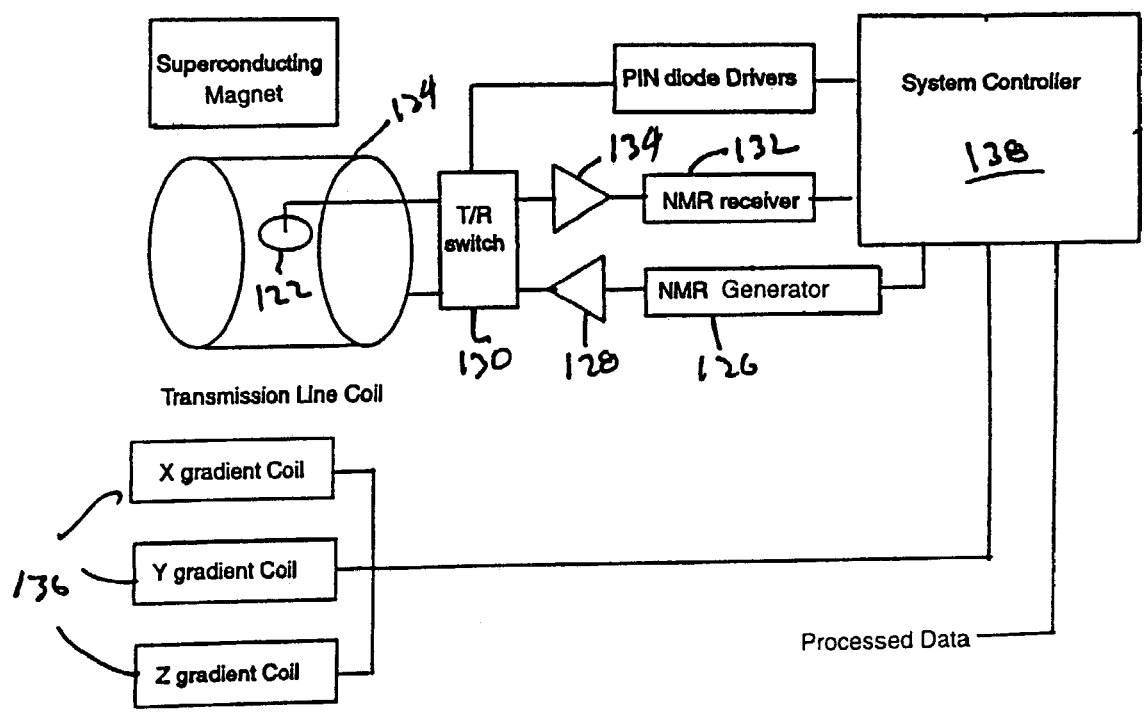
FIG. 22 illustrates an overall system diagram in connection with separate transmit and receive coils in accordance with the present invention.

FIG. 22 is a diagram of a system 120 that uses separate transmit coils 122 and receive coils 124. As shown, an RF generator 126 is connected through an RF power amplifier 128 and T/R switch 130 to one or more transmission line coil elements 122. During transmit, PIN diodes in the coils 122 are biased to allow normal tuned coil operation, while PIN diode circuits detune the receive coil 124. During NMR signal detection, the T/R switch 130 connects the receive coil 124 to a signal receiver 132 through a low-noise preamplifier 134. PIN diodes detune the transmit coil 122, while the receive coils 124 are biased for normal tuned operation. In conjunction with properly timed magnetic field gradient coils 136, the system controller 138 acquires data and processes it into an image or other useful form.

Figure 23:
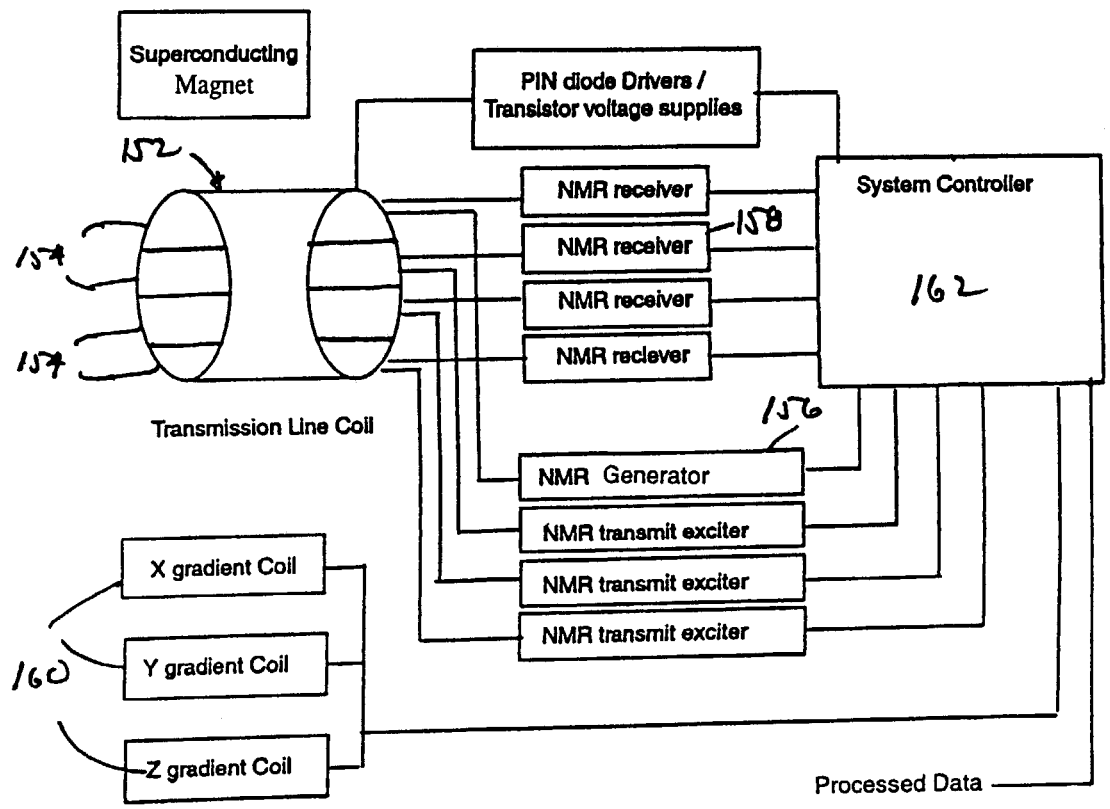
FIG. 23 illustrates an overall system diagram in connection with a transmission line coil used in array mode in accordance with the present invention.

FIG. 23 is a diagram of a system 150 that uses a transmission line coil 152 in array mode. As shown, one or more individual transmission line elements 154 are connected through built-in transistor amplifiers and T/R switches to separate NMR receivers 158 and RF generators 156. During NMR signal generation, each T/R switch connects a transmission line coil element 154 to a generator 156. During NMR signal detection, each T/R switch connects a coil element to a separate signal receiver 158. In conjunction with properly timed magnetic field gradient coils 160, the system controller 162 acquires data and processes it into an image or other useful form. By using separate RF signal generators 156 and receivers 158 for each coil element 154, the signals from individual coil elements 154 can be optimally controlled and processed for maximum advantage.

Figure 24:
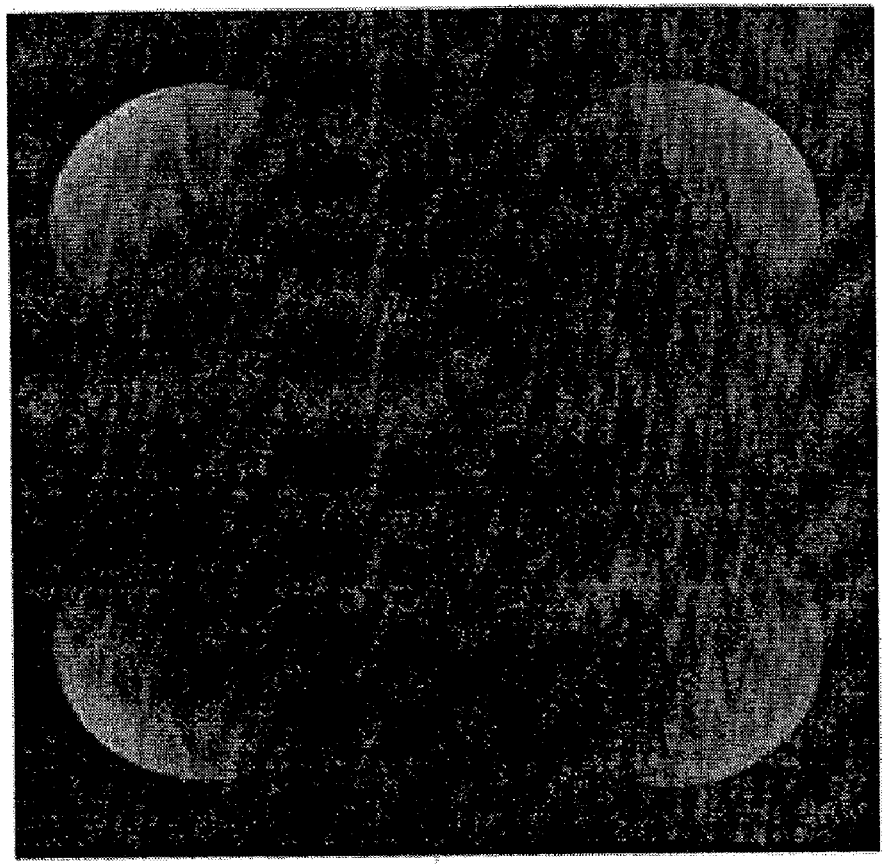
FIG. 24 illustrates images obtained from four element transmission line coil operated in the receive array mode whereby low noise preamplifiers detune the interactions between elements allowing each transmission line element to function independently.

FIG. 24 shows results obtained from such array system. In this case, separate preamplifier/receiver channels on a General Electric (GE) 1.5T MRI scanner are connected to each of four separate transmission line elements arranged in a cylindrically symmetric fashion similar to the 16 element array shown in FIG. 1. The impedance mismatch between the low-noise preamplifiers detunes the mutual inductive coupling between elements and allows the currents on each element to be independent. A PIN diode circuit detunes each transmission line element during transmit to allow larger coil to generate a highly uniform spin excitation field. The images from each transmission line element are independent and can be processed separately to create an image of desired spatial sensitivity.

Figure 25:
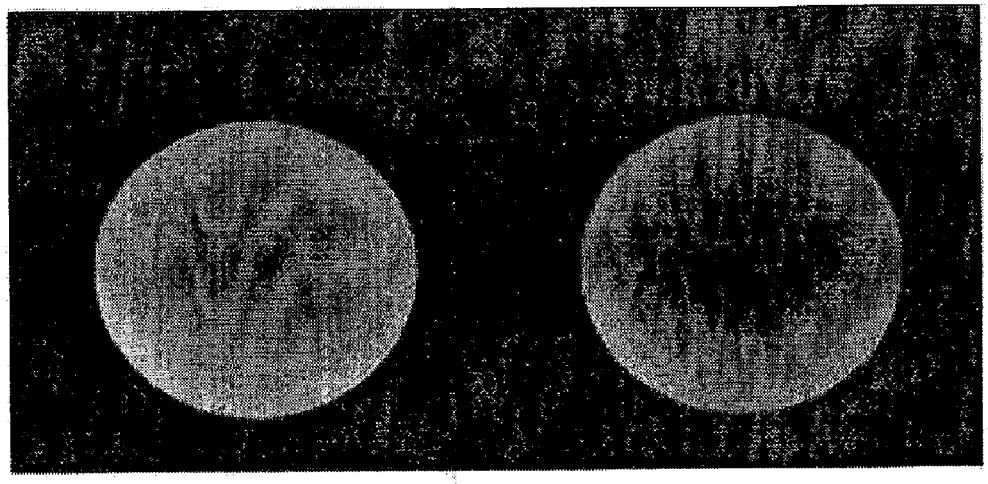
FIG. 25 illustrates the combination of the data shown in FIG. 24 to create either a homogenous mode (left) or a gradient mode (right) image.

FIG. 25 shows the combination of each separate receive channel combined either to create a homogenous image (right) or a gradient mode image (left). Depending on the frequency of operation, a combination of these two images can be used to correct for image intensity variations caused by dielectric resonances or other high-field image artifacts.

Figure 26:
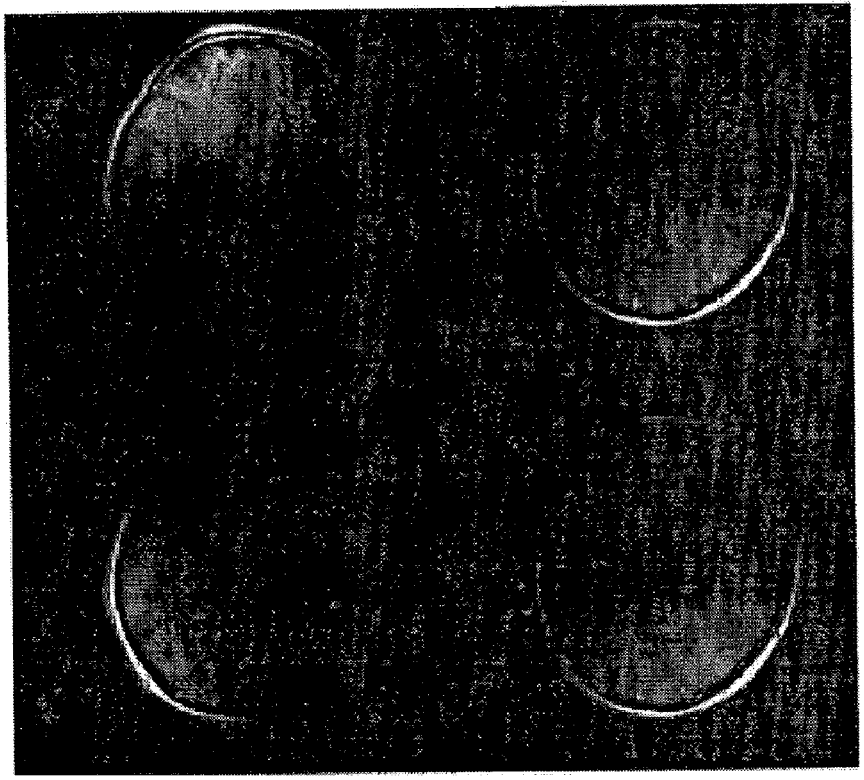
FIG. 26 illustrates human images obtained from an elliptic four element transmission line coil operated in the receive array mode whereby a combination of capacitors and low noise preamplifiers detune the interactions between elements allowing each transmission line element to function independently.

FIG. 26 shows the results obtained with a transmission line array coil with a human volunteer. In this case, the four transmission line elements were arranged in an elliptic fashion to more closely fit the geometry of the human head. A combination of capacitors between elements and the low-noise preamplifiers detuned the coupling between elements allowing each to operate independently. As in FIG. 24, a separate preamplifier/receiver was connected to each transmission line element. A PIN diode detuning circuitry allowed the use of a highly homogenous transmit coil to provide uniform spin excitation. As seen in the images, each transmission line element operates independently providing a high sensitivity image of a portion of the human brain.

Figure 27:
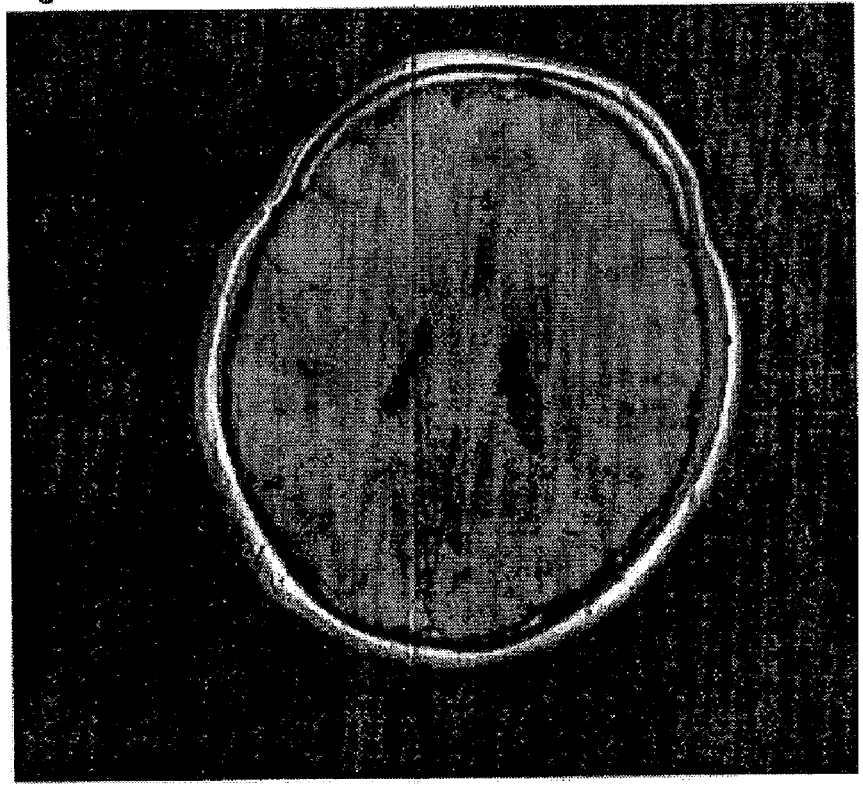
FIG. 27 illustrates the sum-of-squares combination of the images in FIG. 26 to create a high sensitivity homogenous image of the human brain.

FIG. 27 shows a sum-of-squares recombination of the images in FIG. 26. By appropriately combining multiple high-sensitivity images obtained from individual transmission line elements, a homogenous image is obtained which has higher local sensitivity than could be obtained with combining signals from each element with the fixed amplitude and phase relationships as found in FIG. 13.

Thus it has been shown and described an improved NMR coil design based on the use of transmission line elements which satisfies the objects set forth above.

Since certain changes may be made in the present disclosure without departing from the scope of the present invention, it is intended that all matter described in the foregoing specification and shown in the accompanying drawings be interpreted as illustrative and not in a limiting sense.

I claim:

1. A magnetic resonance imaging system comprising:
   (a) a housing providing a medical diagnostic chamber for a subject therewithin lying along an axis;
   (b) a transmit/receive inductor system about said axis in proximity with said housing;
   (c) a gradient inductor system operatively associated with said transmit/receive inductor system;
   (d) a static magnetic field inductor system operatively associated with said transmit/receive inductor system;
   (e) said transmit/receive inductor system including a coil having an outer surface about said axis and including series of electrical transmission line elements distributed with respect to said axis about said subject, each of said transmission line elements including an outer conductor and an inner conductor, said inner conductor being spaced from said outer conductor in a direction perpendicular to said outer surface and between said outer conductor and said axis, said inner conductor and said outer conductor having the same transmit/receive circuit, at least one first capacitive element dispersed among said inner conductor and outer conductor, said coil including second capacitive elements connecting pairs of said conductors;
   (f) said coil initially transmitting to said subject fields of radio frequency energy as a transmit signal, and responsively receiving from said subject fields of magnetic resonance energy as a receive signal;
   (g) said gradient inductor system initiating perturbations in said fields and producing signals derived responsively from said perturbations;
   (h) said signals corresponding to spatial indicia derived from said subject.

2. The magnetic resonance imaging system of claim 1 wherein said second capacitive elements are lumped or distributed.

3. The magnetic resonance imaging system of claim 1 wherein said second capacitive elements are connected between pairs of said outer conductors.

4. The magnetic resonance imaging system of claim 3 wherein said second capacitive elements reduce the radiation losses from said coil.

5. The magnetic resonance imaging system of claim 1 wherein said second capacitive elements are connected between pairs of said inner conductors to minimize coupling between one or more pairs of transmission line elements.

6. The magnetic resonance imaging system of claim 5 including individual power amplifiers connected to at least one of said transmission line elements to allow the current of each transmission line element to be independently controlled.

7. The magnetic resonance imaging system of claim 1 including RF power amplifiers and/or RF receives coupled to at least one of said transmission line elements for transferring energy into said coil during the generation of said transmit signal and out of said coil during the reception of said receive signal.

8. The magnetic resonance imaging system of claim 7 including a plurality of diodes operatively connected to a plurality of said transmission line elements for tuning the coupling between said transmission line elements and said RF amplifiers and receivers.

9. The magnetic resonance imaging system of claim 1 including at least an RF power amplifier reactively coupled to at least one of said transmission line elements for transferring energy into said coil during said generation of said transmit signal, the impedance of said RF power amplifier and the impedance of said one of said transmission line elements being matched.

10. The magnetic resonance imaging system of claim 1 including at least an RF receiver reactively coupled to at least one of said transmission line elements for transferring energy from said coil during said reception of said receive signal, the impedance of said RF receiver and the impedance of said one of said transmission line elements being matched.

11. The magnetic resonance imaging system of claim 1 including individual preamplifiers connected to at least one of said transmission line elements with impedance mismatches designed to allow each transmission line element to operate independently allowing the signals from each transmission line element to be combined either before or after image reconstruction for optimal image reception.

12. The magnetic resonance imaging system of claim 1 including individual preamplifier/receivers connected to at least one of said transmission line elements with the independent information obtained from individual transmission line elements being used to decode spatial information regarding said subject.

13. The magnetic resonance imaging system of claim 1 including individual power amplifiers connected to at least one of said transmission line elements with impedance mismatches to allow the current of each transmission line element to be independently controlled.

14. The magnetic resonance imaging system of claim 1 wherein said coil consists of N transmission line elements arranged in a geometric pattern in which said transmission line elements are substantially equidistant from each other.

15. The magnetic resonance imaging system of claim 14 wherein said geometric pattern is circular or elliptical.

16. The magnetic resonance imaging system of claim 14 wherein said geometric pattern is flat or curved.

17. A magnetic resonance imaging system comprising:
 (a) a housing providing a medical diagnostic chamber with a static homogenous magnetic field for a subject therewithin lying along an axis;
 (b) a plurality of transmit/receive inductor systems about said axis in proximity with said housing;
 (c) a gradient inductor system operatively associated with said transmit/receive inductor systems;
 (d) a static magnetic field inductor system operatively associated with said transmit/receive inductor systems;
 (e) at least one of said transmit/receive inductor systems including a coil having an outer surface about said axis and including a series of electrical transmission line elements distributed with respect to said axis about said subject, each of said transmission line elements including an outer conductor and an inner conductor, said inner conductor being spaced from said outer conductor in a direction perpendicular to said outer surface and between said outer conductor and said axis, said inner conductor and said outer conductor having the same transmit/receive circuit, at least one first capacitive element dispersed among said inner conductor and outer conductor, said coil including second capacitive elements connecting pairs of said conductors;
 (f) each said coil selectively transmitting to said subject fields of radio frequency energy as transmit signals during a transmit function, and selectively receiving from said subject fields of magnetic resonance energy as receive signals during a receive function;
 (g) said gradient inductor system initiating perturbations in said fields and producing signals derived responsively from said perturbations;
 (h) said signals corresponding to spatial indicia derived from said subject.

18. The magnetic resonance imaging system of claim 17 wherein said second capacitive elements are lumped or distributed.

19. The magnetic resonance imaging system of claim 18 wherein said coil consists of N transmission line elements arranged in a geometric pattern in which said transmission line elements are substantially equidistant from each other.

20. The magnetic resonance imaging system of claim 19 wherein said geometric pattern is circular or elliptical.

21. The magnetic resonance imaging system of claim 19 wherein said geometric pattern is flat or curved.

22. The magnetic resonance imaging system of claim 17 wherein said second capacitive elements are connected between pairs of said outer conductors.

23. The magnetic resonance aging system of claim 22 wherein said second capacitive elements reduce the radiation losses from said coil.

24. The magnetic resonance imaging system of claim 17 wherein said second capacitive elements are connected between pairs of said inner conductors to minimize coupling between one or more pairs of transmission line elements.

25. The magnetic resonance imaging system of claim 24 including individual power amplifier operatively connected to at least one of said transmission line elements to allow the current of each transmission line element to be independently controlled.

26. The magnetic resonance imaging system of claim 17 wherein one of said coils is a conventional loop inductor which is detuned during said transmit function, said transit function being performed by a transmission line coil which is detuned during said receive function.

27. The magnetic resonance imaging system of claim 17 wherein one of said coils is a phased array of conventional loop inductor which are detuned during said transmit function, said transmit function being performed by a transmission line coil which is detuned during said receive function.

28. The magnetic resonance imaging system of claim 17 wherein one of said coils is an array of said transmission line elements each operated independently with individual preamplifiers/receivers.

29. The magnetic resonance imaging system of claim 17 wherein one of said coils is an array of said transmission line elements each operated independently with individual preamplifiers/receivers, said array being detuned during said transmit function.

30. The magnetic resonance imaging system of claim 17 wherein said system includes at least two coils, one of said coils being a transmit coil and the other of said coils being a receive coil.

31. The magnetic resonance imaging system of claim 17 including individual power amplifiers connected to at least one of said transmission line elements with impedance mismatches to allow the current of each transmission line element to be independently controlled.

32. A magnetic resonance imaging system comprising:
 (a) a housing providing a medical diagnostic chamber for a subject therewithin lying along an axis;

(b) a transmit inductor system about said axis in proximity with said housing;
(c) a gradient inductor system operatively associated with said transmit inductor system;
(d) a static magnetic field inductor system operatively associated with said transmit inductor system;
(a) said transmit inductor system including a coil having an outer surface about said axis and including a series of electrical transmission line element distributed with respect to said axis about said subject, each of said transmission line elements including an outer conductor and an inner conductor, said inner conductor being spaced from said outer conductor in a direction perpendicular to said outer surface and between said outer conductor and said axis, said inner conductor and said outer conductor having the same transmit circuit, at least one first capacitive element dispersed among said inner conductor and outer conductor, said coil including second capacitive elements connecting pairs of said conductors, said coil including a means for detuning said coil to prevent disturbance of a separate receive inductor system;
(f) said coil initially transmitting to said subject fields of radio frequency energy as a transmit sia;
(g) said gradient inductor system initiating perturbations in said fields.

33. The magnetic resonance imaging system of claim 32 wherein said second capacitive elements are lumped or distributed.

34. The magnetic resonance imaging system of claim 32 wherein said second capacitive elements are connected between pain of said outer conductors.

35. The magnetic resonance imaging system of claim 34 wherein said second capacitive elements reduce to radiation losses from said coil.

36. The magnetic resonance imaging system of claim 32 wherein said second capacitive elements are connected between pairs of said inner conductors to minimize coupling between one or more pairs of mission line elements.

37. The magnetic resonance imaging system of claim 36 including individual power amplifiers connected to at least one of said transmission line elements with impedance mismatches designed to allow the current of each transmission line element to be independently controlled.

38. The magnetic resonance imaging system of claim 32 including RF power amplifiers coupled to at least one of said transmission line elements for transferring energy into said coil during generation of said transmit signal.

39. The magnetic resonance imaging system of claim 32 wherein said receive inductor system includes a conventional loop inductor as a receiver which is detuned during generation of said transit signal, said coil being detuned during reception by said loop inductor.

40. The magnetic resonance imaging system of claim 32 wherein said receive inductor system includes a phased array of conventional loop inductors as a receiver which are detuned during generation of said transmit signal, said coil being detuned during reception by said loop inductors.

41. The magnetic resonance imaging system of claim 32 wherein said receive inductor system includes an array of said transmission line elements, each operated independently with individual preamplifiers/receivers, said array being detuned during generation of said transmit signal.

42. The magnetic resonance imaging system of claim 32 including at least an RF power amplifier reactively coupled to at least one of said transmission line elements for transferring energy into said coil during said generation of said transmit signal, the impedance of said RF power amplifier and the impedance of said one of said transmission line elements being matched.

43. The magnetic resonance imaging system of claim 32 including a plurality of diodes operatively connected to a plurality of said transmission line elements for tuning the coupling between said transmission line elements.

44. The magnetic resonance imaging system of claim 32 including coupling components between one or more of said transmission line elements to allow the currents on each of said transmission line elements to be independently controlled with separate power amplifiers connected to one or more of said transmission line elements allowing a transmit field of desired spatial intensity and phase to be generated.

45. The magnetic resonance imaging system of claim 32 wherein said coil consists of N transmission line elements arranged in a geometric pattern in which said transmission line elements are substantially equidistant from each other.

46. The magnetic resonance imaging system of claim 45 wherein said geometric pattern is circular or elliptical.

47. The magnetic resonance imaging system of claim 45 wherein said geometric pattern is flat or curved.

48. A magnetic resonance imaging system comprising:
(a) a housing providing a medical diagnostic chamber for a subject therewithin lying along an axis;
(b) a receive inductor system about said axis in proximity with said housing;
(c) a gradient inductor system operatively associated with said receive inductor system;
(d) a field inductor system operatively associated with said receive inductor system;
(e) said receive inductor system constituting a coil including an outer surface about said axis and including a series of electrical transmission line elements distributed with respect to said axis about said subject, each of said transmission line elements including an outer conductor and an inner conductor, said inner conductor being spaced from said outer conductor in a direction perpendicular to said outer surface and between said outer conductor and said axis, said inner conductor and said outer conductor having the same receive circuit, at least one first capacitive element dispersed among said inner conductor and outer conductor, said coil including second capacitive elements connecting pairs of said conductor, said coil including a means for detuning said coil to prevent disturbance by transmit fields generated by a separate transmit inductor system during a transmit function;
(f) said coil receiving from said subject fields of magnetic resonance energy during a receive function;
(g) said gradient inductor system initiating perturbations in said fields and producing signals derived responsively from said perturbations;
(g) said signals corresponding to spatial indicia derived from said subject.

49. The magnetic resonance imaging system of claim 48 wherein said second capacitive elements are lumped or distributed.

50. The magnetic resonance imaging system of claim 48 wherein said second capacitive elements are connected between pairs of said outer conductors.

51. The magnetic resonance imaging system of claim 50 wherein said second capacitive elements reduce the radiation losses from said coil.

52. The magnetic resonance imaging system of claim 48 wherein said second capacitive elements are connected between pairs of said inner conductors to minimize coupling between one or more pairs of transmission line elements.

53. The magnetic resonance imaging system of claim 48 including RF receivers coupled to at least one of said transmission line elements for transferring energy out of said coil during said receive function.

54. The magnetic resonance imaging system of claim 53 including a plurality of diodes operatively connected to a plurality of said transmission line elements for tuning the coupling between said transmission line elements and said RF receivers.

55. The magnetic resonance imaging system of claim 48 with individual preamplifiers connected to at least one of said transmission line elements with impedance mismatches designed to allow each of said transmission line elements to operate independently, thereby allowing the signals from two or more of said transmission line elements to be optimally combined either before or after image reconstruction.

56. The magnetic resonance imaging system of claim 48 with individual preamplifier/receivers connected to at least one of said transmission line elements with the independent information obtained from individual transmission line elements being used to decode spatial information regarding said subject.

57. The magnetic resonance imaging system of claim 48 wherein said coil consists of N transmission line elements arranged in a geometric pattern in which said transmission line elements are substantially equidistant from each other.

58. The magnetic resonance imaging system of claim 57 wherein said geometric pattern is circular or elliptical.

59. The magnetic resonance imaging system of claim 57 wherein said geometric pattern is flat or curved.

* * * * *